United States Patent
Yim

(10) Patent No.: US 7,588,865 B2
(45) Date of Patent: Sep. 15, 2009

(54) PHOTO MASK AND METHOD FOR MANUFACTURING PATTERNS USING THE SAME

(75) Inventor: Dong Gyu Yim, Gyunggi-Do (KR)

(73) Assignee: Hynix Semiconductor Inc., Icheon-Si (KR)

( * ) Notice: Subject to any disclaimer, the term of this patent is extended or adjusted under 35 U.S.C. 154(b) by 771 days.

(21) Appl. No.: 11/106,232

(22) Filed: Apr. 14, 2005

(65) Prior Publication Data

US 2006/0121362 A1    Jun. 8, 2006

(30) Foreign Application Priority Data

Dec. 2, 2004    (KR) ...................... 10-2004-0100516

(51) Int. Cl.
    *G03F 1/00*    (2006.01)
(52) U.S. Cl. ........................... 430/5; 430/311; 430/322
(58) Field of Classification Search ............... 430/5, 430/311, 322
    See application file for complete search history.

(56) References Cited

U.S. PATENT DOCUMENTS

| 4,609,566 A | 9/1986 | Hongo et al. |
| 4,650,983 A | 3/1987 | Suwa |
| 6,627,361 B2 * | 9/2003 | Bula et al. ..................... 430/5 |
| 2003/0013024 A1 * | 1/2003 | Pierrat ............................ 430/5 |
| 2003/0194613 A1 * | 10/2003 | Voutsas et al. ................. 430/5 |
| 2004/0053142 A1 * | 3/2004 | Wang et al. ..................... 430/5 |

FOREIGN PATENT DOCUMENTS

| JP | 2004-308012 | 11/2004 |
| KR | 1995-0001970 | 1/1995 |
| KR | 1996-0015340 | 5/1996 |
| KR | 0170719 | 3/1999 |
| KR | 1999-0066046 | 8/1999 |
| WO | WO-02/03140 A1 | 1/2002 |

* cited by examiner

*Primary Examiner*—Mark F Huff
*Assistant Examiner*—Stewart A Fraser
(74) *Attorney, Agent, or Firm*—Marshall, Gerstein & Borun LLP

(57) ABSTRACT

A photo mask, which has subsidiary patterns added into holes formed through a plurality of ring gate patterns having vertically symmetrical structures used in a semiconductor exposure step, such that the subsidiary patterns are separated from the ring gate patterns by a designated distance, and a method for manufacturing patterns using the same. The subsidiary patterns are located in the holes at positions separated from the ring gate patterns by the designated distance, thereby reducing variation of critical dimensions of one pair of the vertically opposite ring gate patterns, which must be the same, due to lens aberration, thereby precisely forming fine patterns.

8 Claims, 3 Drawing Sheets

PHOTO MASK AND METHOD FOR MANUFACTURING PATTERNS USING THE SAME

BACKGROUND

1. Technical Field

A photolithography technique is disclosed, and more particularly to a photo mask, which reduces the difference in critical dimensions between patterns formed thereon, and a method for manufacturing patterns using the same is also disclosed.

2. Discussion of the Related Art

Photolithography techniques are known, in which patterns having designated shapes are formed on a wafer substrate using light. Such photolithography techniques have led to the high integration of a semiconductor device. Specifically, light, such as ultraviolet rays, an electron beam, or X-rays, is irradiated from an exposure apparatus to a position, at which patterns for insulating films or conductive films are formed, thus producing a photoresist, the solubility of which is changeable. A designated portion of the photoresist is exposed to light using a photo mask, and a part of the photoresist having a high solubility in a developing solution is removed. Thereby, photoresist patterns having designated shapes are obtained. By removing the part of the wafer, which is exposed from the photoresist patterns to the outside, by an etching step, semiconductor element patterns having desired shapes are formed.

FIG. 1 is a schematic view illustrating a conventional exposure apparatus. The conventional exposure apparatus comprises a condenser lens 20 for condensing light, such as a laser beam of an exposure source 10, a projection lens 40 for condensing the light into a wafer 50 arranged below the condenser lens 20, and a photo mask 30, having patterns 32 in designated shapes formed thereon, arranged between the condenser lens 20 and the projection lens 40 for patterning a photoresist 52 of the wafer 50.

In the above exposure apparatus, the laser beam irradiated from the exposure source 10 passes through the photo mask 30 through the condenser lens 20, is condensed by the projection lens 40, and is then transmitted to the wafer 50. Thereby, the patterns 32 on the photo mask 30 are projected on the photoresist 52 on the wafer 50.

In the case that a pattern, which is formed on a photo mask for a DRAM or a flash memory, is repeated and has a fine shape, the patterns on the photo mask are not projected onto the wafer in the same patterns, but are deformed so that the wafer patterns have critical dimensions (CDs) or a fidelity differing from desirable CDs or fidelity due to lens aberration of the exposure apparatus.

For example, in the case that each pattern formed on a wafer is a circular ring gate as shown in FIG. 2, an array of rectangular ring gate patterns 32 having vertically symmetrical structures are arranged on the photo mask.

Critical dimensions between the opposite ring gate patterns 32 having the vertically symmetrical structures are changed due to the lens aberration.

Photolithography techniques for embodying a high resolution to form finer patterns so as to meet high-integration and high-density trends of recent semiconductor devices are achieved by several methods, i.e., correction of a light source (for example, off-axis illumination), manufacture of a mask using optical interference effect (for example, attenuating phase shift, alternating phase shift, or etc.), and correction of the layout of a photo mask for preventing any optical proximity effect.

Accordingly, a photolithography technique for more precisely manufacturing fine patterns using the above methods must be studied and developed.

SUMMARY OF THE DISCLOSURE

Therefore, in view of the above problems, an improved photo mask is provided, which has subsidiary patterns formed in holes or open areas of the ring gate patterns having symmetrical structures so as to reduce variation of critical dimensions generated between adjacent patterns due to lens aberration and thus to precisely form fine patterns. A method for manufacturing patterns using the same is also disclosed.

A disclosed photo mask comprises a plurality of ring gate patterns having vertically symmetrical structures used in an exposure step of a semiconductor device, wherein subsidiary patterns are added into holes formed through the ring gate patterns such that the subsidiary patterns are separated from the ring gate patterns by a designated distance.

A disclosed method for manufacturing patterns on a wafer using a photo mask that has a plurality of ring gate patterns with vertically symmetrical structures, comprises: performing an exposure step using the photo mask having subsidiary patterns added into holes formed through the ring gate patterns such that the subsidiary patterns are separated from the ring gate patterns by a designated distance; and patterning a photoresist on the wafer using ring gate patterns formed on the photoresist by the exposure step.

BRIEF DESCRIPTION OF THE DRAWINGS

The above and other objects, features and advantages of the disclosed patterns and methods will be more clearly understood from the following detailed description taken in conjunction with the accompanying drawings, wherein.

DETAILED DESCRIPTION OF THE PRESENTLY PREFERRED EMBODIMENTS

Figure 1:
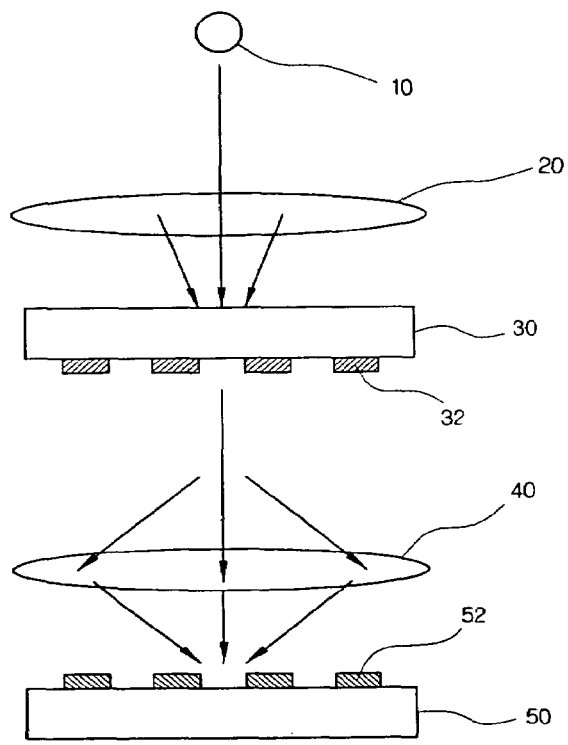
FIG. 1 is a schematic view illustrating a conventional exposure apparatus.
Figure 2:
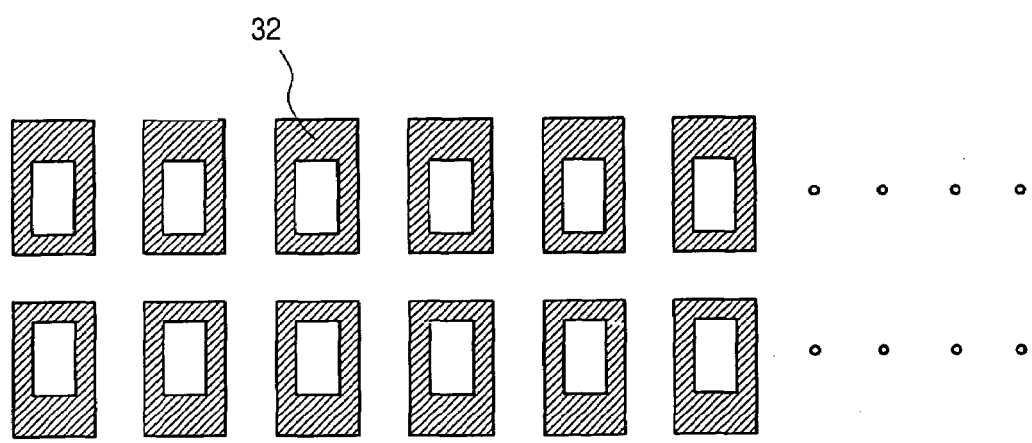
FIG. 2 is a view illustrating a layout of ring gate patterns of a conventional photo mask.

Now, a preferred embodiment will be described in detail with reference to the annexed drawings, so that those skilled in the art will appreciate the disclosed subject matter.

In order to precisely illustrate several layers and regions in the drawings, thicknesses thereof are enlarged. In the following description, the same or similar elements are denoted by the same reference numerals.

Figure 3:
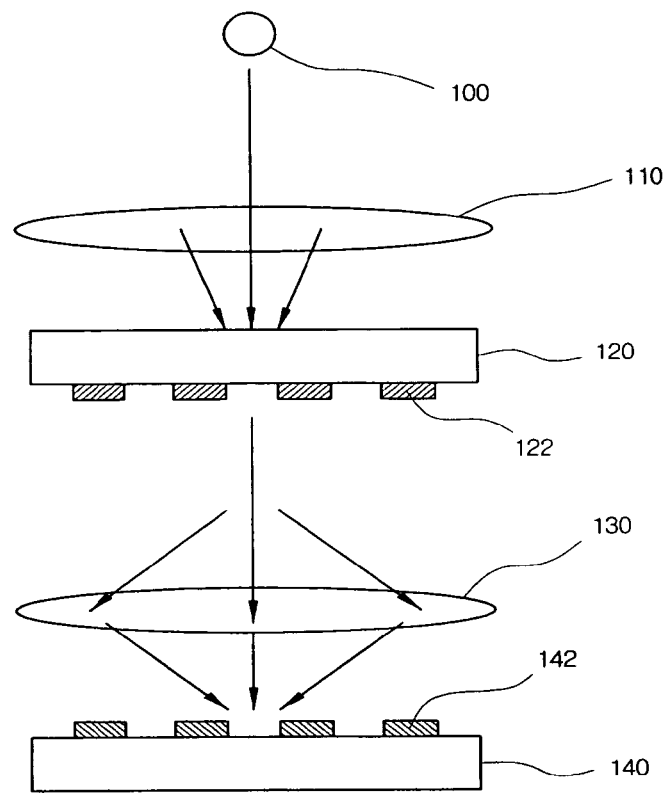
FIG. 3 is a schematic view illustrating an exposure apparatus using a photo mask in accordance with this disclosure.

FIG. 3 is a schematic view illustrating an exposure apparatus using a photo mask in accordance with this disclosure.

As shown in FIG. 3, the exposure apparatus of the present invention comprises a condenser lens 110 for condensing light, such as a laser beam, of an exposure source 100, a projection lens 130 for condensing the light into a wafer 140 arranged below the condenser lens 110, and a photo mask 120, having patterns 122 formed in designated shapes, arranged between the condenser lens 110 and the projection lens 130 for patterning a photoresist 142 of the wafer 140.

Each of a pattern 122 on the photo mask 120 of the disclosed photo mask has a rectangular ring gate shape and is repeated, and one pair of the upper and lower ring gate patterns 122 are opposite to each other such that the upper and lower patterns 122 are symmetrical. A subsidiary pattern is inserted into the hole of each of the ring gate patterns 122 such that the subsidiary pattern is separated from the pattern 122 by a designated distance.

When an exposure step with the exposure apparatus using the photo mask 120 is performed, the laser beam irradiated from the exposure source 100 passes through the condenser lens 110 and the ring gate patterns 122 of the photo mask 120 having the subsidiary patterns, is condensed by the projection lens 130, and is then transmitted to the wafer 140. Accordingly, the ring gate patterns 122 on the photo mask 120 are projected on the photoresist 142 on the wafer 140, thereby forming circular ring gate patterns having the same shape as that of the ring gate patterns 122 on the photoresist 142 on the wafer 140. Here, the subsidiary patterns in the holes of the ring gate patterns 122 have a minimum size so that the subsidiary patterns are not projected on the photoresist 142 on the wafer 140.

Figure 4:
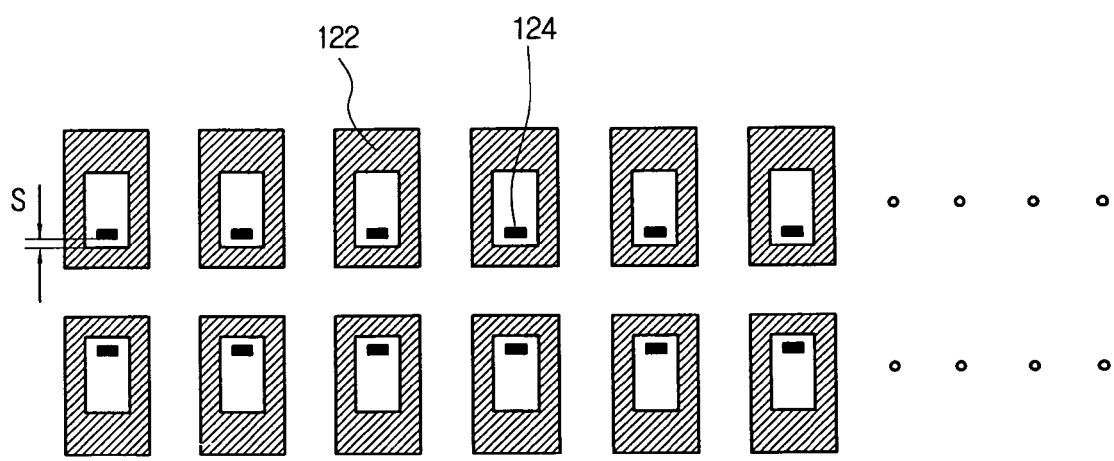
FIG. 4 is a view illustrating a layout of ring gate patterns, to which subsidiary patterns are added, of a disclosed photo mask.

FIG. 4 is a view illustrating a layout of ring gate patterns, to which subsidiary patterns are added, of the disclosed photo mask.

With reference to FIG. 4, an array of rectangular ring gate patterns 122 having vertically symmetrical structures are arranged on the photo mask, and the subsidiary patterns 124 are arranged in holes or open areas of the ring gate patterns 122 such that the subsidiary patterns 124 are respectively separated from the corresponding ring gate patterns 122 by a designated distance.

For example, each of the subsidiary patterns 124 has a regular square shape and dimensions in the range of from about 20×20 nm to about 120×120 nm so that the subsidiary patterns 124 are not patterned on the wafer.

In the case that the widths of the left and right portions of the ring gate pattern 122 are uniform, and a portion of each of the ring gate patterns 122 having a large width is defined as the upper portion and a portion of each of the ring gate patterns 122 having a small width is defined as the lower portion, the subsidiary pattern 124 is located at a position separated from the upper surface of the lower portion of the ring gate pattern 122 along the Y-axis by a distance (S) of from about 150 nm to about 190 nm.

In the disclosed photo mask, a difference in critical dimensions between one pair of opposite ring gate patterns 122 having vertically symmetrical structures is reduced by the subsidiary patterns 124 located in the holes thereof. That is, the critical dimensions of the opposite ring gate patterns 122 reduce variation in the sensitivity of the patterns 122 due to lens aberration, thereby minimizing the optical proximity effect generated between neighboring patterns.

Figure 5:
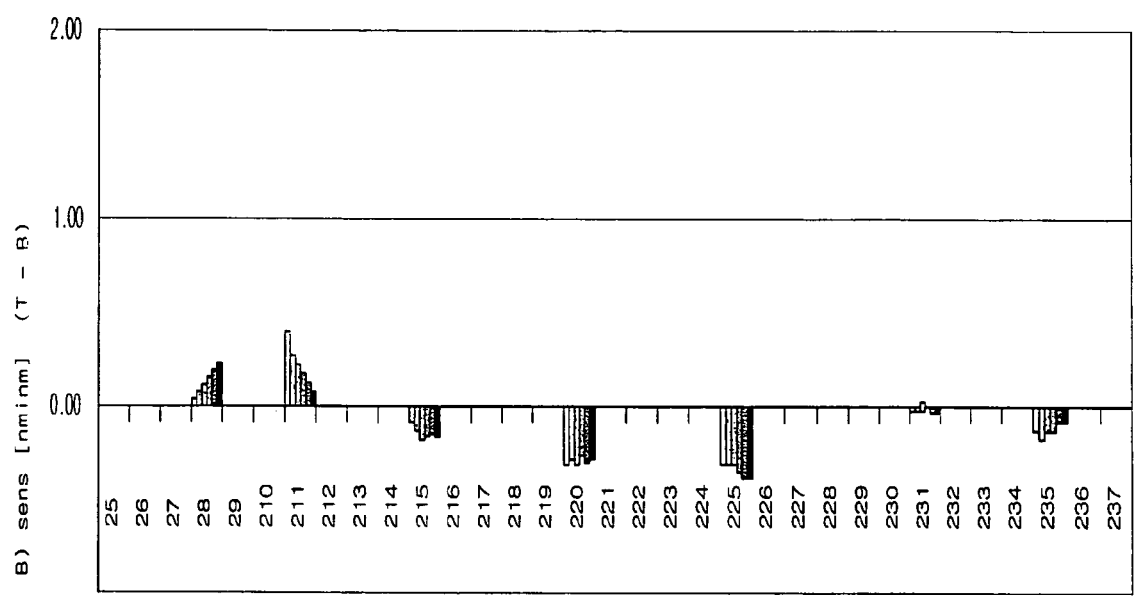
FIG. 5 is a graph comparatively illustrating differences between upper and lower portions of wafer patterns in exposure steps using the conventional photo mask and disclosed photo masks having the subsidiary patterns.

FIG. 5 is a graph comparatively illustrating differences between upper and lower portions of wafer patterns in exposure steps using the conventional photo mask and the disclosed photo mask having subsidiary patterns.

With reference to FIG. 5, in the exposure step, sensitivity of lens aberration due to a difference (T-B) between upper and lower portions of the wafer patterns in case the conventional photo mask without subsidiary patterns of (expressed by a clean bar) and the sensitivity of lens aberration due to a difference (T-B) in the upper and lower portions of the wafer patterns for the photo masks with subsidiary patterns are compared for patterns having dimensions of 60×60 nm, 80×80 nm, 90×90 nm, 100×100 nm, and 120×120 nm, located in ring gate patterns having vertically symmetrical structures.

As illustrated in FIG. 5, the sensitivity of lens aberration due to the difference (T-B) between the upper and lower portions of the wafer patterns for the conventional photo mask without any subsidiary patterns is higher than the sensitivity of the lens aberration due to the difference (T-B) between upper and lower portions of the wafer patterns for the disclosed photo masks with subsidiary patterns.

Figure 6:
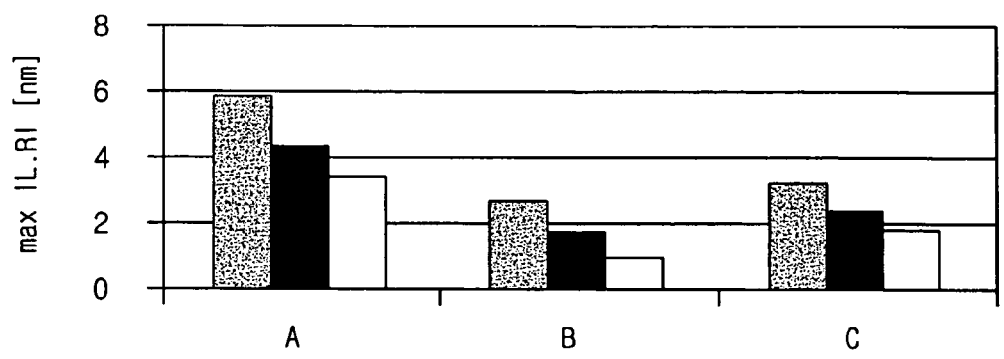
FIG. 6 is a graph comparatively illustrating differences of sizes between the left and right portions of the wafer patterns in the exposure steps using the conventional photo mask and disclosed photo masks having subsidiary patterns.

FIG. 6 is a graph illustrating the differences in sizes between left and right portions of wafer patterns in the exposure steps using the conventional photo mask and the disclosed photo mask having the disclosed subsidiary patterns.

With reference to FIG. 6, in the exposure steps using different lenses (A, B, and C), a difference (max |L-R|) of sizes between left and right portions of wafer patterns in the case that the conventional photo mask without subsidiary patterns (expressed by a left bar), a difference (max |L-R|) in sizes between the left and right portions of wafer patterns in the case that a photo mask with subsidiary patterns, having dimensions of 90×90 nm and a distance of 150 nm, located in ring gate patterns in accordance with this disclosure (expressed by a central bar), and a (max |L-R|) difference of sizes between left and right portions of wafer patterns in the case that a photo mask with subsidiary patterns, having dimensions of 100×100 nm and a distance of 190 nm, located in ring gate patterns in accordance with this disclosure (expressed by a right bar) are compared.

As illustrated in FIG. 6, the difference (max |L-R|) in size between left and right portions of wafer patterns in the case that the conventional photo mask without subsidiary patterns is higher than the difference (max |L-R|) in sizes between left and right portions of wafer patterns with the photo mask with subsidiary patterns in accordance with this disclosure.

Accordingly, variation in the sensitivity of the opposite ring gate patterns due to lens aberration is reduced by the subsidiary patterns added into the ring gate patterns having vertically symmetrical structures. Thereby, variations in critical dimensions of the opposite ring gate patterns are uniformly maintained.

As apparent from the above description, the disclosed photo mask has subsidiary patterns added to holes of ring gate patterns having vertically symmetrical structures so as to reduce variation of critical dimensions generated between the neighboring ring gate patterns due to lens aberration and thus to precisely form fine wafer patterns.

Although the preferred embodiment has been disclosed for illustrative purposes, those skilled in the art will appreciate that various modifications, additions and substitutions are possible, without departing from the scope and spirit of this disclosure and the accompanying claims.

What is claimed is:

1. A photo mask comprising:
   a plurality of pairs of ring gate patterns, each ring gate pattern of the pair being adjacent to and arranged vertically opposite to each other, the ring gate patterns each defining an open area, and
   each open area of each ring gate pattern includes a subsidiary pattern close to and spaced from an opposite side of their corresponding ring gate pattern by a designated distance.

2. The photo mask according to claim 1, wherein the subsidiary patterns have a square shaped cross section.

3. The photo mask according to claim 1, wherein the subsidiary patterns have dimensions in the range of from about 20×20 nm to about 120×120 nm.

4. The photo mask according to claim 1, wherein the subsidiary patterns are separated from upper surfaces of lower portions of the corresponding ring gate patterns by a distance in the range from about 150 nm to about 190 nm.

5. A method for manufacturing patterns on a wafer using a photo mask having a plurality of pairs of ring gate patterns, each ring gate pattern of the pair being adjacent to and arranged to be vertically opposite to each other, comprising:

performing an exposure step using the photo mask having subsidiary patterns added into an open area formed by the ring gate patterns such that the subsidiary patterns are close to a side opposite the open area defined by the ring gate patterns; and patterning a photoresist disposed on the wafer using ring gate patterns formed on the photo mask by the exposure step.

6. The method according to claim 5, wherein the subsidiary patterns have square shaped cross sections.

7. The method according to claim 5, wherein the subsidiary patterns have dimensions in the range from about 20×20 nm to about 120×120 nm.

8. The method according to claim 5, wherein the subsidiary patterns are located at positions separated from upper surfaces of lower portions of the corresponding ring gate patterns along the Y-axis by a distance in the range of from about 150 nm to about 190 nm.

* * * * *